United States Patent [19]

Parker

[11] Patent Number: 4,542,533
[45] Date of Patent: Sep. 17, 1985

[54] TUNING SYSTEM WITH AUTOMATIC FREQUENCY CONTROL

[75] Inventor: James S. Parker, Portsmouth, Va.

[73] Assignee: General Electric Company, Portsmouth, Va.

[21] Appl. No.: 604,566

[22] Filed: Apr. 27, 1984

[51] Int. Cl.⁴ .............................................. H04B 1/26
[52] U.S. Cl. ................................... 455/182; 455/183; 455/186
[58] Field of Search ............... 455/164, 165, 182, 183, 455/192, 185, 186; 358/195.1, 193.1; 331/1 A

[56] References Cited

U.S. PATENT DOCUMENTS

| | | | |
|---|---|---|---|
| 4,280,140 | 7/1981 | Skerlos | 455/182 |
| 4,408,349 | 10/1983 | Yukawa | 455/182 |
| 4,451,850 | 5/1984 | Kamemoto | 455/183 |
| 4,498,191 | 2/1985 | Rogers | 455/182 |

*Primary Examiner*—Jin F. Ng

[57] ABSTRACT

A microprocessor controlled phase locked loop tuning system is disclosed which comprises a microprocessor (10) that provides frequency data to the PLL (11), this data controlling a programmable frequency divider in the PLL to determine the nominal frequency of a VCO (131) in a tuner (13). The AFC detector (141) in the intermediate frequency module (14) provides an error voltage output to the AFC comparator (15). The comparator produces a low or a high output to the microprocessor depending on whether the error voltage exceeds a second input voltage to the comparator. This second input voltage is an increasing voltage from a time constant network (16) controlled by the microprocessor. The microprocessor program includes a loop wherein the microprocessor alternately increments a register and reads the output of the comparator until the voltage from the time constant network exceeds the error voltage from the AFC detector. The value in the register is then proportional to the error voltage. This number is saved and used to alter the output to the PLL if required to correct the VCO frequency.

3 Claims, 5 Drawing Figures

TUNING SYSTEM WITH AUTOMATIC FREQUENCY CONTROL

RELATED APPLICATION

This application is related in subject matter to the invention disclosed in application Ser. No. 06/501,685 filed June 6, 1983, now U.S. Pat. No. 4,498,191, by Terrence E. Rogers entitled "Digital Automatic Frequency Control with Tracking" and assigned to the assignee of this application. The disclosure of that application is incorporated herein by reference.

FIELD OF THE INVENTION

The present invention generally relates to electronic tuning systems which provide automatic frequency control (AFC) and, more particularly, to a microprocessor controlled phase locked loop (PLL) tuning system which provides an improved method of automatic frequency control for a television or similar type of tuner.

BACKGROUND OF THE INVENTION

Microprocessor controlled tuning systems are being widely used in television receivers. One approach to such tuning systems is to use a microprocessor to control a PLL that corrects for drift in the local oscillator phase thereby insuring that the local oscillator is always precisely in phase with a fixed frequency crystal oscillator. A specific example of an electronic, mircroprocessor controlled television tuning system is disclosed in U.S. Pat. No. 4,280,140 issued to Peter C. Skerlos. In this system, AFC discriminator information is provided to the microprocessor for the generation of digital outputs for controlling stepwise tuning adjustments. This information is generated by a pair of window comparators, edge/direction comparator, and a vertical sync detector. When a channel is selected, the tuning system first synthesizes the correct frequency for that channel. Then the microprocessor first looks at the output of the edge/direction comparator to determine the direction of tuning. Once the proper tuning direction is determined by the edge/direction comparator, the microprocessor then steps the AFC tuning voltage in predetermined increments until the limit of the number of allowed steps for that particular channel is reached. When this limit is reached and no carrier is found, tuning is switched and the voltage stepping procedure is initiated again. For a detected carrier to be valid, the output of the window comparators should be high and the vertical sync detector should produce a train of 60 Hz pulses, indicating the presence of vertical sync information. Although one would expect the Skerlos system to work well, in the highly competitive television market the cost of implementing such a system is objectionable.

An alternative tuning system is disclosed in the above-referenced application Ser. No. 06/501,685 filed by Terrence E. Rogers uses a single detector whose threshold is controlled by the microprocessor for detecting the arrival at the proper frequency. More specifically, the mircroprocessor sends frequency data to the PLL. The PLL also receives a sample of the voltage controlled oscillator (VCO) located in the tuner and compares it with a crystal standard by dividing the VCO sample according to the frequency data and applying it to a phase detector whose other input is connected to a divided down crystal oscillator signal. The phase detector produces output pulses that vary in width and polarity as a function of whether the VCO signal is above or below the proper frequency and phase required by the frequency data. A loop filter converts the pulses into a varying d.c. voltage which in turn is used to control the VCO. A portion of the i.f. amplifier is arranged so that it can detect errors in the desired i.f. This automatic frequency control (AFC) detector is connected to an AFC comparator whose output is connected to the microprocessor. The output of the AFC comparator is a logic "1" if the carrier frequency is higher than the input data value and a logic "0" if the carrier frequency is lower than the input data value. The microprocessor has an offset control so that the exact value of voltage at which the AFC comparator switches from a logic "1" to a logic "0" can be controlled by the microprocessor.

SUMMARY OF THE INVENTION

It is an object of this invention to provide an improved automatic frequency control method which requires only one AFC detector reading and VCO adjustment to tune to the proper frequency.

It is another object of the invention to provide an AFC system which provides a faster response compared to the present AFC techniques which use an iterative procedure to search for the proper frequency.

It is a further object of the invention to provide such an improved AFC method and system which requires fewer components and is therefore less expensive to build.

According to the present invention, the AFC circuit comprises an RC time constant network, a comparator circuit, an AFC detector circuit, and the microprocessor which is used for controlling the tuner. The RC time constant network preferably takes the form of a series resistance and capacitance connected between a source of charging voltage and ground. One port of the microporcessor is connected in common to the junction between the resistance and capacitance and one input of the comparator. The other input of the comparator is connected to the output of the AFC detector. Initially, the one port of the microprocessor is set low which holds the output of the comparator at a low voltage. To start the AFC process, the one port of the microprocessor is set to its high impedance state so that the capacitance charges through the resistance causing the voltage at the first input of the comparator to rise in an approximately linear manner. As the voltage rises, the microprocessor alternately reads a second port which is connected to the output of the comparator and increments a counter. When the voltage at the first input of the comparator rises above the AFC votage at the second input from the AFC detector, the comparator output goes high and counting is stopped. The number held in the counter is proportional to the AFC voltage and is therefore proportional to the present tuning error. From this error number, the proper PLL divide ratio is obtained and the VCO is set to the corrected frequency.

BRIEF DESCRIPTION OF THE DRAWINGS

The foregoing and other objects, aspects and advantages of the invention will be better understood from the following detailed description with reference to the drawings, in which.

DETAILED DESCRIPTION OF THE INVENTION

Figure 1:
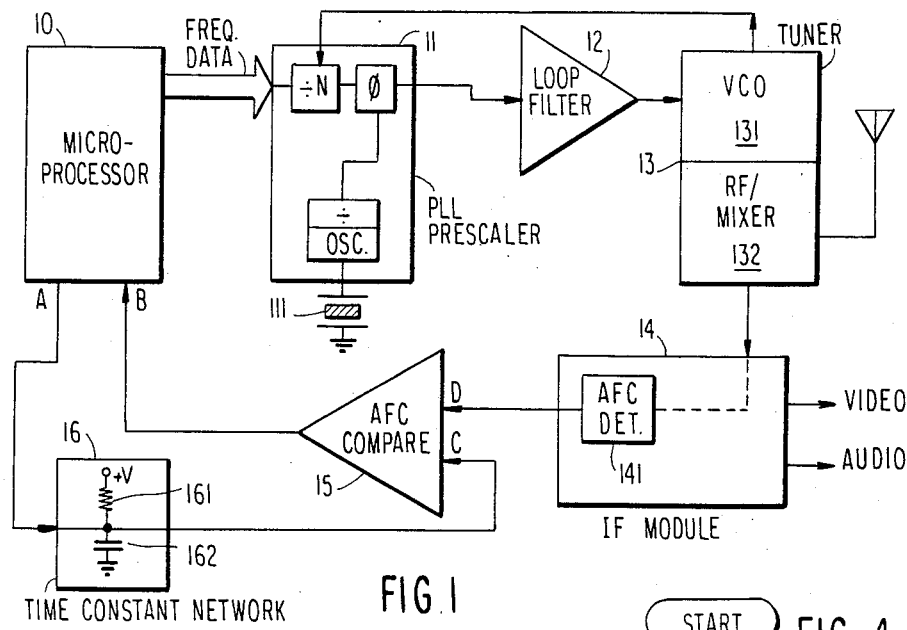
FIG. 1 is a block diagram of a microprocessor-based tuning system incorporating the AFC method according to the present invention.

Referring now to the drawings, and more particularly to FIG. 1, a microprocessor 10 responds to user input data indicating the selection of a particular receiving frequency and sends frequency data to the phase locked loop (PLL) circuit 11. The PLL circuit receives a sample of the voltage controlled oscillator (VCO) 131 located in the tuner 13 and compares it with a crystal standard 111 by dividing the VCO sample according to the frequency data and applying it to a phase detector whose other input is connected to a divided down crystal signal. The comparator output pulses vary in width and polarity as the VCO signal is above or below the proper frequency and phase required by the frequency data. The loop filter 12 converts the pulses into a varying d.c. voltage which in turn is used to control the VCO. This feedback is arranged in such a way that the frequency tends to remain at the value required by the frequency data supplied by the microprocessor. The VCO 131 is also used in a hetrodyne frequency mixer in the r.f. portion 132 of the tuner 13 where it converts the incoming r.f. of the selected receiving frequency from the antenna to the common i.f. of the i.f. module 14. A portion of the i.f. module is arranged so that it can detect errors in the i.f. carrier frequency. This AFC detector 141 is connected to one input of the AFC comparator 15 whose output is connected to port B of the microprocessor 10. A time constant network 16 is connected to the other input of the AFC comparator 15 and is controlled by port A of the microprocessor 10. Port A of the microprocessor has a high impedance state and high and low voltage output states. The time constant network preferably comprises a resistor 161 and a capacitor 162 connected in series between a source of charging voltage +V and ground. The junction between resistor 161 and capacitor 162 is connected both to port A of the microporcessor 10 and the second input of the AFC comparator 15. When the output of the time constant network is at a lower voltage than the output of the AFC detector, the AFC comparator output is low. Otherwise, the AFC comparator output is high.

Figure 2:
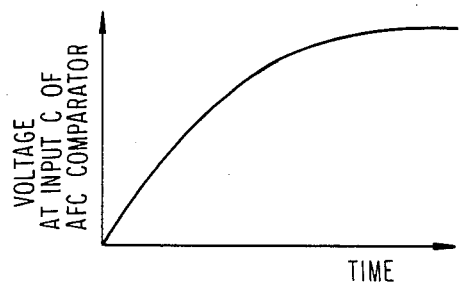
FIG. 2 is a graph showing the voltage rise at the first input to the comparator due to the charging of the capacitor in FIG. 1.
Figure 3:
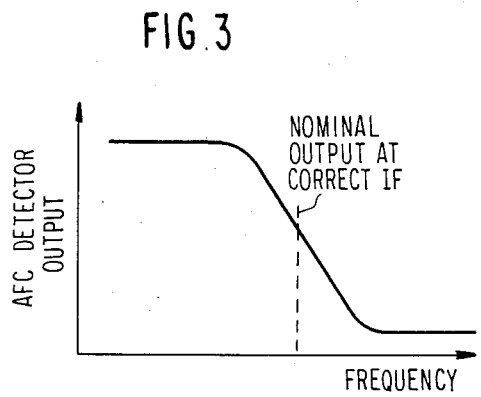
FIG. 3 is a graph showing the AFC detector curve and illustrating the operation of the invention.

The operation of the AFC system as follows. Initially, port A of the microprocessor is set to its low voltage output state which discharges the capacitor 162 and holds the second input to the AFC comparator 15 at a low voltage. The output of the AFC comparator is also low. To start the AFC process, port A of the microprocessor is set to its high impedance state. The output of the time constant network 16 and therefore the voltage at the second input of the AFC comparator 15 begins to rise in an approximately linear manner as shown in FIG. 2. As the voltage rises, the microporcessor alternately checks port B to see if it has changed to a high state and increments a register. This reading and counting process continues until the voltage at the second input of AFC comparator 15 rises above the AFC detector ouput voltage. When this happens, the comparator output goes high, and the microprocessor stops counting. The number held in the microprocessor's register is a digital representation of the AFC detector's output voltage, and therefore represents any error from the nominal i.f. The microprocessor 10 uses this AFC number to determine the proper frequency data to load into the PLL 11. Once the proper station has been tuned, the microprocessor can check to see if the signal has drifted by performing the same AFC procedure. The results of several AFC read operations can be averaged if necessary to reduce the affect of noise. The AFC detector in the region of interest has a response that is approximated by the curve shown in FIG. 3. In the central portion of the AFC detector curve where the response is approximately linear, the AFC number obtained by the microprocessor can be used to set the tuner directly to the proper frequency. On the upper or lower portions of the AFC detector curve where the response is flat, the AFC number indicates the direction for the tuner to move. In this case, the tuner frequency must be incremented in the proper direction until the linear portion of the detector curve is reached.

Figure 4:
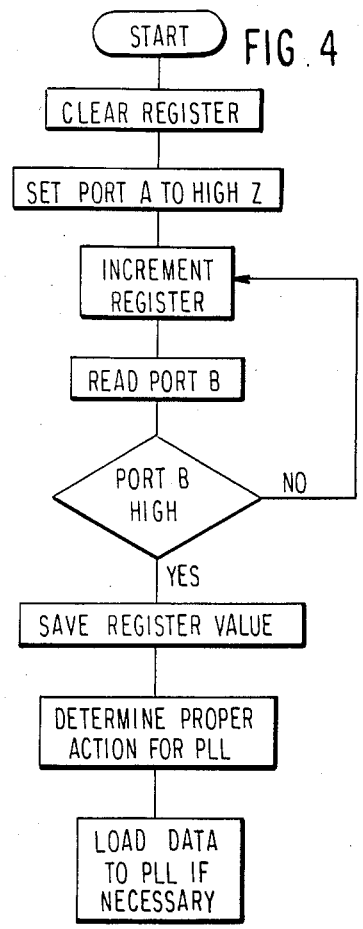
FIG. 4 is a flow chart illustrating the AFC sequence according to the invention.
Figure 5:
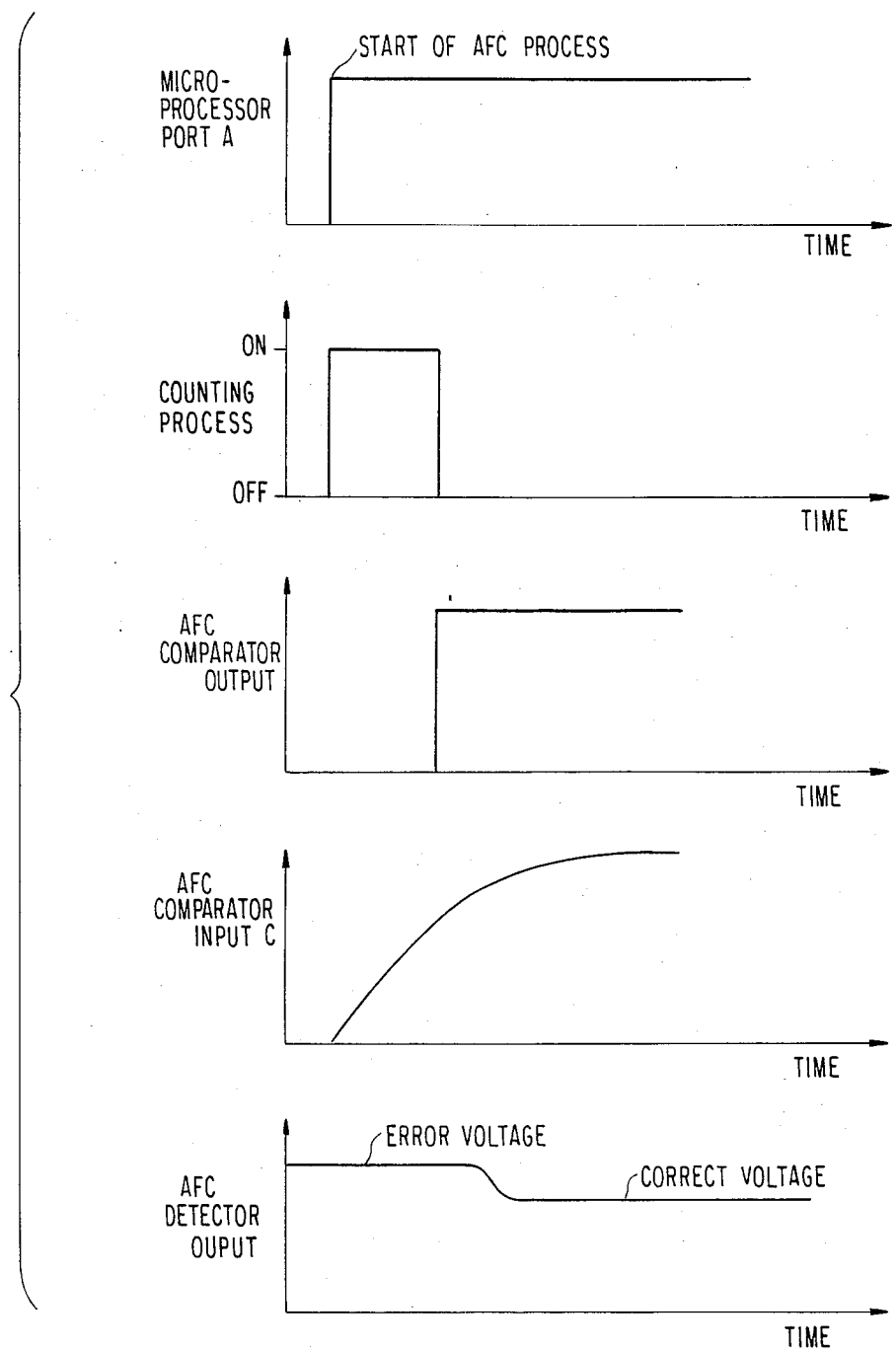
FIG. 5 is a timing diagram showing the AFC operation timing.

The AFC sequence according to the invention is summarized in the flow chart shown in FIG. 4, and the AFC operation timing is shown in FIG. 5. Initially, port A of the microporcessor is at a low value forcing the output of the AFC comparator to be low. Then port A is set to its high impedance state allowing the capacitor in the time constant network to charge through the resistor to supply an increasing voltage to one input of the AFC comparator. The microporcessor program includes a loop wherein it alternately increments an internal register and reads port B until such time that port B is high. This occurs when the voltage output from the time constant circuit exceeds the voltage output from the AFC detector. Thus, the program loop performs an analog to digital conversion of the voltage output of the AFC detector and the number in the internal register is a digital representation of that voltage. This number is saved and used to determine the proper action for the PLL. If necessary the frequency data loaded into the PLL is altered and reloaded to effect the correction indicated at the bottom of FIG. 5.

Thus, it will be appreciated that the AFC technique according to the present invention provides a very fast response while using but a few components compared with prior AFC systems. For example, the AFC comparator can be implemented with two transistors and the time constant network requires only a resistor and a capacitor. Because of the procedure employed, a major advantage of the invention is that while on the linear portion of the AFC detector curve (FIG. 3), only one AFC reading and VCO adjustment is required to tune to the proper frequency. In addition, this system, like that disclosed by Terrence E. Rogers in application Ser. No. 06/501,685, allows the system to tune to signals that are offset from the nominal frequency as well as to periodically determine if an aquired signal has drifted and to make corrections, if needed.

I claim:

1. In a microprocessor controlled phase locked loop tuning system of the type wherein the microprocessor is responsive to an output frequency selection to produce an output to a programmable frequency divider in the phase locked loop which determines the nominal local oscillator frequency and the intermediate frequency of the tuning system is detected to produce an error voltage indicative of the deviation of the intermediate frequency from a nominal value, the improvement comprising:

AFC comparator means having first and second inputs and an output, said first input being connected to receive said error voltage and said output being connected to an input port of said microprocessor, the output of said AFC comparator means being in a first state when the voltage at said second input is less that the voltage at said first input; and time constant means controlled by said microprocessor and connected to said second input of said AFC comparator means for providing an increasing voltage to said second input, said microprocessor being programmed to alternately increment an internal register and sample the output of said AFC comparator means until said output changes from said first state to a second state indicating that the voltage from said time constant means exceeds said error voltage, the number in said internal register then being a digital representation of said error voltage which can be used by said microprocessor to modify said output to said programmable frequency divider.

2. The improved microprocessor controlled phase locked tuning system as recited in claim 1 wherein said time constant means comprises a resistor and a capacitor connected in series between a source of voltage and ground, the junction of said resistor and capacitor being connected to said second input of said AFC comparator and also to an output port of said microprocessor, said output port having a high impedance state and high and low voltage output states, the low voltage output state causing said capacitor to be discharged and said capacitor charging through said resistor from said source of voltage when said output port assumes its high impedance state.

3. A method for automatic frequency control in a microprocessor controlled phase locked loop tuning system of the type wherein the microprocessor is responsive to an output frequency selection to produce an output to a programmable frequency divider in the phase locked loop which determines the nominal local oscillator frequency and the tuning system intermediate frequency carrier is detected to generate an error voltage indicative of the deviation of the intermediate frequency carrier from a predetermined frequency, said method comprising the steps of clearing an internal register in said microprocessor, generating an increasing voltage having a predetermined time constant, alternately incrementing said internal register and comparing said increasing voltage with said error voltage and saving the value in said internal register when said increasing voltage exceeds said error voltage, and using said value saved in said internal register to alter the output to said programmable frequency divider if necessary in order to adjust said intermediate frequency to said predetermined frequency.

* * * * *